(12) United States Patent
Wang et al.

(10) Patent No.: US 11,099,615 B2
(45) Date of Patent: Aug. 24, 2021

(54) DISPLAY PANEL, MANUFACTURING METHOD THEREOF AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Benlian Wang, Beijing (CN); Xiangdan Dong, Beijing (CN); Weiyun Huang, Beijing (CN); Young Yik Ko, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 630 days.

(21) Appl. No.: 16/070,427

(22) PCT Filed: Jan. 19, 2018

(86) PCT No.: PCT/CN2018/073430
§ 371 (c)(1),
(2) Date: Jul. 16, 2018

(87) PCT Pub. No.: WO2018/227973
PCT Pub. Date: Dec. 20, 2018

(65) Prior Publication Data
US 2021/0208644 A1  Jul. 8, 2021

(30) Foreign Application Priority Data

Jun. 16, 2017 (CN) .......................... 201710456618.2

(51) Int. Cl.
*H01L 27/12* (2006.01)
*G06F 1/18* (2006.01)

(52) U.S. Cl.
CPC ............ *G06F 1/189* (2013.01); *H01L 27/124* (2013.01)

(58) Field of Classification Search
CPC ..................................................... H01L 27/124
(Continued)

(56) References Cited

U.S. PATENT DOCUMENTS 6,690,032 B1 * 2/2004 Umetsu ............... G02F 1/13452
257/72
2009/0026614 A1  1/2009 Jung
(Continued)

FOREIGN PATENT DOCUMENTS

CN   101355044 A    1/2009
CN   102237303 A   11/2011
(Continued)

OTHER PUBLICATIONS

The Second Chinese Office Action dated May 17, 2019; Appln. No. 201710456618.2.
(Continued)

*Primary Examiner* — Sherman Ng

(57) ABSTRACT

A display panel, a manufacturing method thereof, and a display device are provided. The display panel includes: a display substrate, a COF film disposed on a side of the display substrate; a plurality of signal lines disposed on another side of the display substrate, an insulation layer located between the signal lines and the display substrate, a plurality of connection holes penetrating at least the display substrate, the signal lines and the insulation layer and a conductive material filled in the connection holes. The signal lines are connected to connection terminals disposed on the
(Continued)

COF film by the conductive material; the insulation layer has recesses each of which surrounds the respective connection holes.

16 Claims, 6 Drawing Sheets

(58) Field of Classification Search
USPC .......................................................... 361/748
See application file for complete search history.

(56) References Cited

U.S. PATENT DOCUMENTS

| | | |
|---|---|---|
| 2010/0013060 A1 | 1/2010 | Lamy et al. |
| 2011/0234964 A1* | 9/2011 | Moriwaki ......... G02F 1/136204 349/149 |
| 2014/0035159 A1 | 2/2014 | Di Franco et al. |
| 2014/0184057 A1* | 7/2014 | Kim ..................... H05B 33/145 313/504 |
| 2015/0340419 A1 | 11/2015 | Li et al. |
| 2016/0035747 A1* | 2/2016 | Zhang ................... G02F 1/1345 257/72 |
| 2016/0049356 A1* | 2/2016 | Jung ....................... H01L 24/48 257/774 |
| 2017/0048990 A1* | 2/2017 | Sim ....................... H04M 1/026 |
| 2017/0365652 A1 | 12/2017 | Li |

FOREIGN PATENT DOCUMENTS

| | | |
|---|---|---|
| CN | 104035253 A | 9/2014 |
| CN | 104851892 A | 8/2015 |
| CN | 104904327 A | 9/2015 |
| CN | 105829996 A | 8/2016 |
| CN | 107039377 A | 8/2017 |
| CN | 108666286 A | 10/2018 |
| JP | 08298285 A | 11/1996 |
| JP | 2002-040472 A | 2/2002 |

OTHER PUBLICATIONS

The International Search Report and English Translation of the Written Opinion dated Mar. 27, 2018; PCT/CN2018/0734430.
The First Chinese Office Action dated Nov. 5, 2018; Appln. No. 201710456618.2.

* cited by examiner

DISPLAY PANEL, MANUFACTURING METHOD THEREOF AND DISPLAY DEVICE

TECHNICAL FIELD

The present disclosure relates to a display panel, a manufacturing method thereof and a display device.

BACKGROUND

With the continuous improvement of display technology, display panels have been more widely used in display products. The display product with a narrow bezel has attracted a lot of consumers because users will have a better viewing experience with it.

SUMMARY

An embodiment of the disclosure provides a display panel comprising: a display substrate, a film for chip-on-film (COF film) disposed on a side of the display substrate opposite to a display surface of the display substrate, and an integrated circuit chip fixed on a side of the COF film opposite to the display substrate, further comprising in a periphery region of the display substrate: a plurality of signal lines, disposed on the display surface of the display substrate an insulation layer, located between the signal lines and the display substrate; a plurality of connection holes, penetrating at least the display substrate, the signal lines and the insulation layer; and a conductive material, filled in the connection holes, wherein the signal lines are connected to connection terminals disposed on the COF film by the conductive material, wherein the insulation layer has recesses each of which surrounds the respective connection holes, and the conductive material is in contact with a surface of the signal lines at the recesses.

In some examples, the display panel further comprises an adhesive disposed between the display substrate and the COF film, the COF film being fixed on the side of the display substrate opposite to the display surface by the adhesive.

In some examples, a surface of the conductive material in contact with the signal lines is flush with a surface of the signal lines in a region outside the recesses.

In some examples, the conductive material is a nano-metal material.

In some examples, the nano-metal material is a nano-silver material.

In some examples, an aperture diameter of each the connection holes is greater than or equal to 25 µm; and a diameter of the nano-silver material is less than 3 µm.

In some examples, the adhesive is an anisotropic conductive adhesive, the connection holes penetrate only the display substrate, the signal lines, and the insulation layer; the connection terminals are disposed on a side of the COF film facing the display substrate; and the signal lines are connected to the connection terminals by the conductive material and the anisotropic conductive adhesive.

In some examples, the connection holes penetrate the display substrate, the signal lines, the insulation layer and the adhesive; the connection terminals are disposed on a side of the COF film facing the display substrate.

In some examples, the connection holes penetrate the display substrate, the signal lines, the insulation layer, the adhesive, and the COF film; the connection terminals are disposed on a side of the COF film opposite to the display substrate.

In some examples, the connection holes are in one-to-one correspondence with the connection terminals; and a size of each of the connection terminals is larger than an aperture diameter of each of the connection holes.

In some examples, the display panel further comprises a flexible circuit board, bonded to a side of the COF film opposite to the display substrate.

Another embodiment of the disclosure provides a display device comprising any of the above-mentioned the display panels.

Another embodiment of the disclosure provides a method of manufacturing a display panel, comprising: forming an insulation layer in a periphery region of a display surface of a display substrate, and forming a plurality of recesses in a surface of the insulation layer; forming a plurality of signal lines on the insulation layer in the periphery region of the display surface of the display substrate; mounting an integrated circuit chip on a COF film; attaching the COF film to a side of the display substrate opposite to the display surface with the integrated circuit chip being located on a side of the COF film opposite to the display substrate; forming a plurality of connection holes penetrating at least the display substrate, the signal lines, and the insulation layer in a periphery region of the display substrate, and each of the recesses surrounding the respective connection holes; and filling a conductive material into the connection holes, so that the signal lines are connected to connection terminals disposed on the COF film by the conductive material, the conductive material being in contact with a surface of the signal lines at the recesses.

In some examples, filling the conductive material into the connection holes comprises: injecting a nano-metal slurry from a side of the display surface of the display substrate into the connection holes by a nozzle dripping method or an inkjet printing method; and performing a cooling process on the display panel, so that the nano-metal slurry in the connection holes is cured.

In some examples, filling the conductive material into the connection holes comprises: forming a nano-metal slurry on the periphery region of the display surface of the display substrate by a coating method or a screen printing method, so that the nano-metal slurry is filled into the connection holes; performing a cooling process at the connection holes of the display substrate, so that the nano-metal slurry in the connection holes is cured; and removing the nano-metal slurry outside the connection holes.

In some examples, the COF film is attached to the display substrate by an anisotropic conductive material and the plurality of connection holes are formed before the COF film is attached to the display substrate, and the anisotropic conductive material is in a conductive state only in an extending direction of the connection holes.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

A thickness and shape of each film layer in accompanying drawings do not reflect a real scale of a display panel and are only intended to illustrate the present disclosure.

Figure 1A:
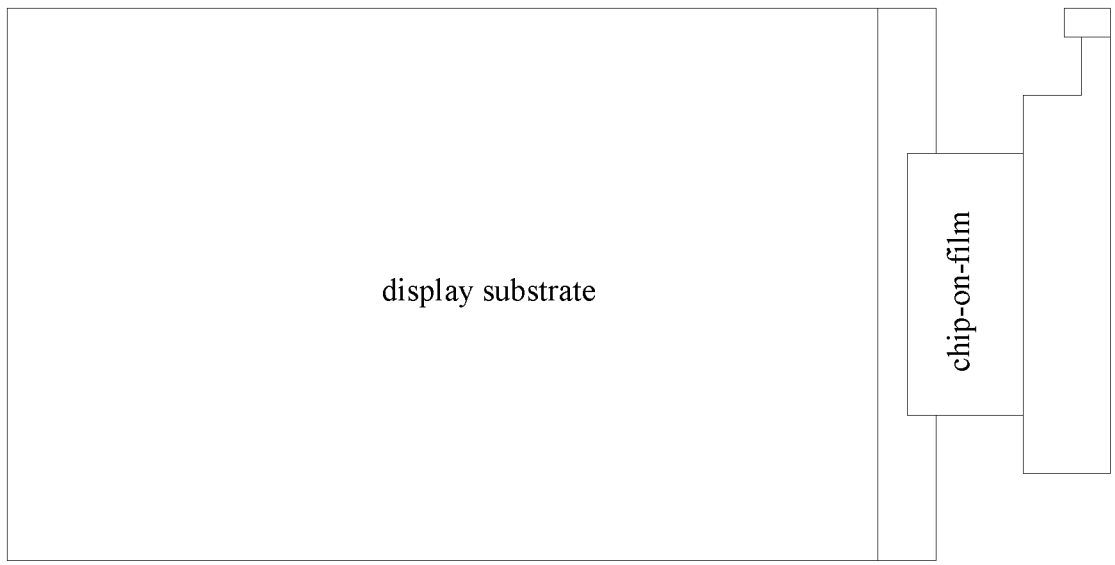
FIGS. 1*a* and 1*b* are structure schematic diagrams of a display panel in related arts respectively.
Figure 1B:
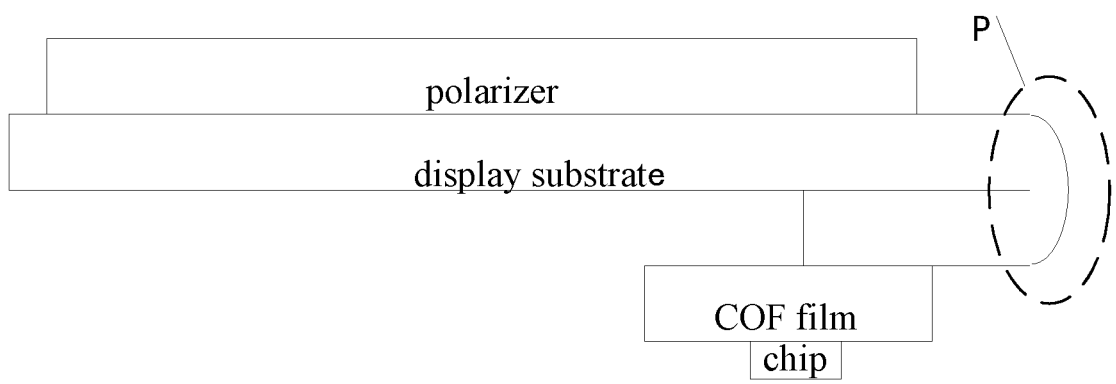

A display product with a narrow bezel can be achieved by bending a connection terminal. However, the display product produced by the process of bending the connection terminal has a yield problem. For example, when the display product illustrated in FIG. 1a is bent, an inorganic insulation layer of a connection terminal bend region P as illustrated in FIG. 1b is likely to be cracked, resulting in display failure. For example, the inorganic insulation layer of the connection terminal bend region P can be removed by adding a mask process; and an organic insulation layer can be formed in the connection terminal bend region P by adding another mask process to avoid the display failure due to cracks resulting from the inorganic insulation layer of the connection terminal bend region P. In this way, although the phenomenon of display failure due to the cracks resulting from the inorganic insulation layer is avoided in some degree, two mask processes are added, which increases the process difficulty and the manufacturing cost, and reduces the production efficiency. In addition, formation of the connection terminal bend region P requires more space, and the utilization ratio of the display substrate produced by the connection terminal bending process is relatively higher than that of a display product with a same size manufactured without the connection terminal bending process. Therefore, how to obtain a display product with a narrow bezel without the connection terminal bending process is a technical problem that needs to be solved urgently at present.

Figure 2A:
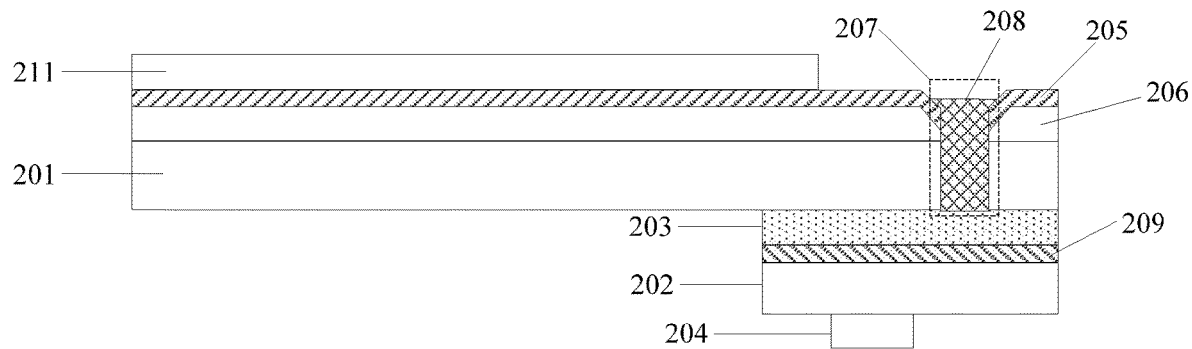
FIGS. 2*a* to 2*d* are structure schematic diagrams of a display panel provided by an embodiment of the disclosure respectively.

A display panel provided by an embodiment of the present disclosure, as illustrated in FIG. 2a, comprises: a display substrate 201, a film for chip-on-film (COF film) 202 disposed on a side of the display substrate 201 opposite to a display surface of the display substrate, an adhesive 203 disposed between the display panel 201 and the COF film 202, and an integrated circuit chip 204 fixed to a side of COF film 202 opposite to the display substrate 201.

The COF film 202 is fixed on the side of the display substrate 201 opposite to the display surface by the adhesive 203.

A plurality of signal lines 205, an insulation layer 206 between the signal lines 205 and the display substrate 201, a plurality of connection holes 207 penetrating at least the display substrate 201, the respective signal lines 205 and the insulation layer 206, and a conductive material 208 filled in at least respective connection holes 207 are disposed on a periphery region of the display surface of the display substrate 201; the signal lines 205 are connected to connection terminals 209 disposed on the COF film 202 by the conductive material 208.

The insulation layer 206 has a plurality of recesses a around the respective connection holes 207, and the conductive material 208 is in contact with a surface of the signal lines 205 at the recesses a.

For example, in the above-mentioned display panel provided by the embodiment of the disclosure, because the adhesive film 203 is used to attach the COF film 202 to the side of the display substrate 201 opposite to the display surface, and then the conductive material 208 is disposed in the plurality of the connection holes 207 penetrating at least the display substrate 201, the respective signal lines 205 and the insulation layer 206, a connection between the signal lines 205 in the periphery region of the display surface of the display substrate 201 and the connection terminals 209 disposed on the COF film 202 can be implemented. Therefore, the connection terminal bending process is not required, so that the connection terminal bend region will not exist in the periphery region of the display panel, thereby making the display panel bezel narrower. Also, because the insulation layer 206 is provided with the plurality of recesses a each of which surrounds the respective connection holes 207, it can ensure that the conductive material 208 is in contact with the surface of the signal lines 205 at the recesses a, which increases the contact area between the conductive material 208 and the signal lines 205, and can prevent the risk caused by failure of forming holes and filling the conductive material 208, thereby increasing the product yield.

For example, although the COF film is attached to the display substrate by the adhesive layer in the above embodiment, embodiments according to the disclosure are not limited to this.

Figure 2B:
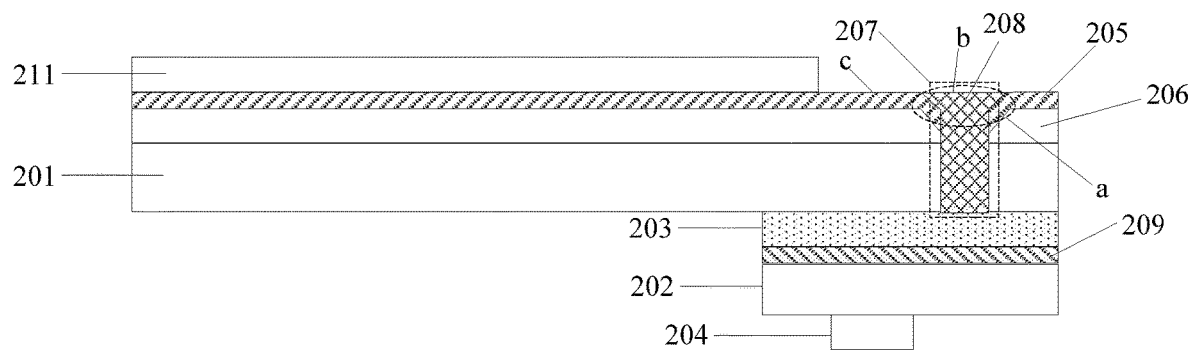

For example, in the above-mentioned display panel provided by the embodiment of the disclosure, in order to maximize the contact area between the conductive material 208 and the signal lines 205, as illustrated in FIG. 2b, a surface b where the conductive material 208 is in contact with the signal lines 208 is flush with a surface c of a region of the signal lines 205 outside the recesses a, i.e., the surface of the conductive material 208 on the side of the display substrate 201 is flush with the surface of the signal lines 205. That is to say, the upper surface of the conductive material 208 located at the recesses is flush with the upper surface of the portion of the signal lines outside the recesses. In this way, the contact area between the conductive material 208 and the signal line 205 can be maximized, thereby minimizing the risk of poor contact between the conductive material 208 and the signal lines 205, and improving the product yield.

For example, in the above-mentioned display panel provided by the embodiment of the disclosure, the conductive material 208 can be a metal material with a smaller resistivity and a better conductive property. In addition, in order to increase the yield of filling the conductive material 208 into the connection holes 207, the nano-metal material can be selected as the conductive material 208. On the one hand, this is because the nano-metal material has a smaller particle size and has a better filling property in the connection holes 205, so that the problem of disconnection does not easily occur. On the other hand, for example, the nano-metal material can be selected as the conductive material 208, and in this way, when the conductive material 208 is used to fill the connection holes 205, a liquid nano-metal slurry having thermoplasticity can be filled into the connection holes 205 in a specific manner, so that the conductive material 208 can be quickly and seamlessly filled into the connection holes 205, and then cured and modeled by a cooling process to achieve conduction of the conductive material 208. An example of filling the nano-metal material into the connection holes 205 will be described in detail in the method of manufacturing the display panel described below, and details will be omitted here.

For example, in the above-mentioned display panel provided by the embodiment of the disclosure, a nano-silver material with better fluidity and better conductivity can be selected as the conductive material 208.

Further, in the above-mentioned display panel provided by the embodiment of the disclosure, according to the limitation of the process for forming the holes, an aperture diameter of the respective connection holes is generally greater than or equal to 25 µm; and a diameter of the nano-silver material is generally less than 3 µm. Therefore, the nano-silver material will have the excellent filling property in the connection holes 205 and will not cause the problem of disconnection.

For example, in the above-mentioned display panel provided by the embodiment of the disclosure, the adhesive 203 for fixing the COF film 202 to the side of the display substrate 201 opposite to the display surface can, for example, adopt an insulation adhesive or an anisotropic conductive adhesive, which are not limited herein.

For example, in the above-mentioned display panel provided by the embodiment of the disclosure, according to the material adopted by the adhesive 203, the connection holes 207 disposed in the periphery region of the display surface of the display substrate 201 and the connection terminals 209 correspondingly disposed on the COF film 202 can have a variety of arrangements and be manufactured by a variety of manufacturing processes, which will be described in detail by following examples.

For example, when the anisotropic conductive adhesive is selected as the adhesive 203, the anisotropic conductive adhesive is in a conductive state only in the extending direction of the connection holes 207 and is in an insulation state in a direction perpendicular to the extending direction of the connection hole 207. In this case, in the above-mentioned display panel provided by the embodiment of the disclosure, as illustrated in FIGS. 2a and 2b, the connection holes 207 can be disposed to penetrate only the display substrate 201, the signal lines 205, and the insulation layer 206.

The connection terminals 209 can be disposed on a side of the COF film 202 facing the display substrate 201. For example, the connection terminals 209 are generally located below the connection holes 207.

In this case, the signal lines 205 are connected to the connection terminals 209 by the conductive material 208 and the anisotropic conductive adhesive.

According to the arrangement of the connection holes 207 and the connection terminals 209, in manufacturing, the periphery region of the display surface of the display substrate 201 can be punched to form the connection holes 207 before the COF film 202 and the display substrate 201 are attached. Compared to punching the display substrate 201 after the display substrate 201 is attached to the COF film 202, obviously, in the actual manufacturing process, the method of separately punching the display substrate 201 requires relatively simple operation and low production cost, and has high production efficiency. Of course, according to the arrangement of the connection holes 207 and the connection terminals 209, the display substrate 201 can be punched after the COF film 202 and the display substrate 201 are attached, which is not limited herein.

Furthermore, before the COF film 202 and the display substrate 201 are attached, the periphery region of the display surface of the display substrate 201 is punched, and the aperture diameter of the formed connection holes 207 and the size of the connection terminals 209 connected to the formed connection holes will not influence each other. That is, the aperture diameter of the respective connection hole 207 can be greater than, equal to, or less than the size of the connection terminals 209, which is not limited herein.

Figure 2C:
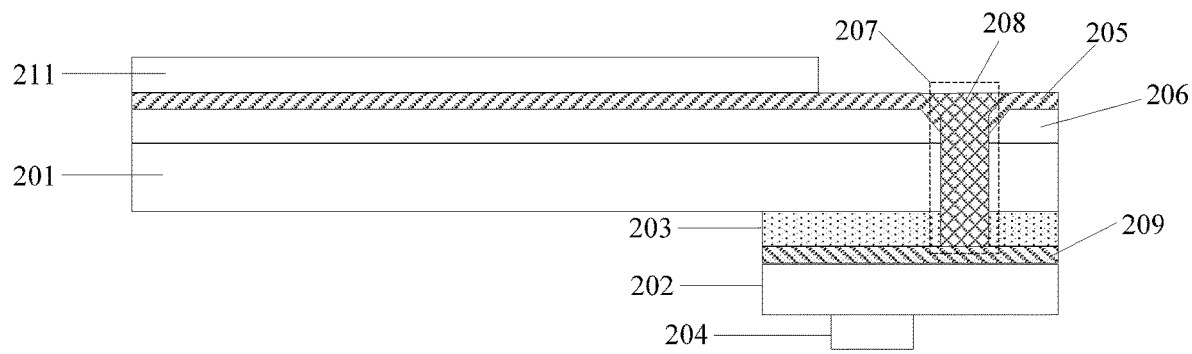

Also, regardless selecting the anisotropic conductive adhesive or the insulation adhesive as the adhesive 203, in the above-mentioned display panel provided by the embodiment of the disclosure, as illustrated in FIG. 2c, the connection holes 207 can also be disposed to penetrate the display substrate 201, the respective signal lines 205, the insulation layer 206 and the adhesive 203.

Correspondingly, the connection terminals 209 can be disposed on the side of the COF film 202 facing the display substrate 201; for example, the connection terminals 209 are generally located directly below the connection holes 207.

According to the arrangement of the connection holes 207 and the connection terminals 209, in manufacturing, the periphery region of the display surface of the display substrate 201 can be punched to form the connection holes 207 after the COF film 202 and the display substrate 201 are attached.

Figure 2D:
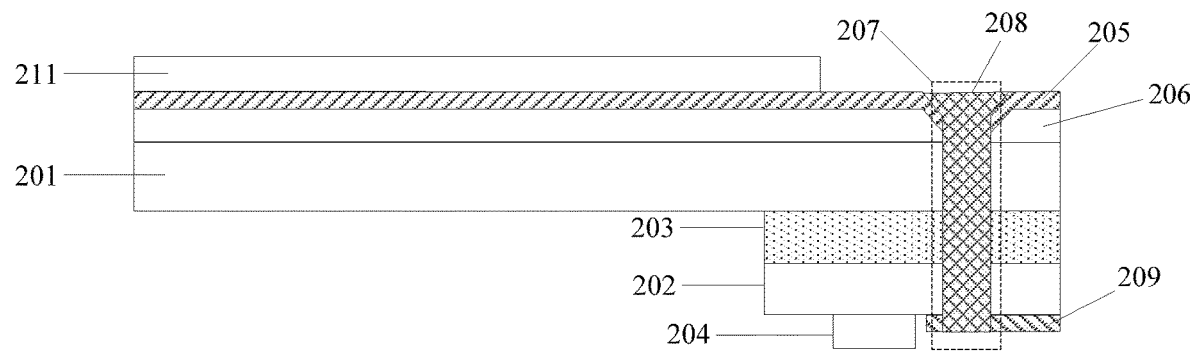

Also, regardless selecting the anisotropic conductive adhesive or the insulation adhesive as the adhesive 203, in the above-mentioned display panel provided by the embodiment of the disclosure, as illustrated in FIG. 2d, the connection holes 207 can also be disposed to penetrate the display substrate 201, the respective signal lines 205, the insulation layer 206, the adhesive 203, and the COF film 202.

Correspondingly, the connection terminals 209 can be disposed on the side of the COF film 202 opposite to the display substrate 201; for example, the connection terminals 209 are generally located directly below the connection holes 207.

According to the arrangement of the connection holes 207 and the connection terminals 209, in manufacturing, after the COF film 202 and the display substrate 201 are attached, the periphery region of the display surface of the display substrate 201 can be punched to form the connection holes 207 or a side of the COF film 202 can be punched, which is not limited herein.

Figure 3A:
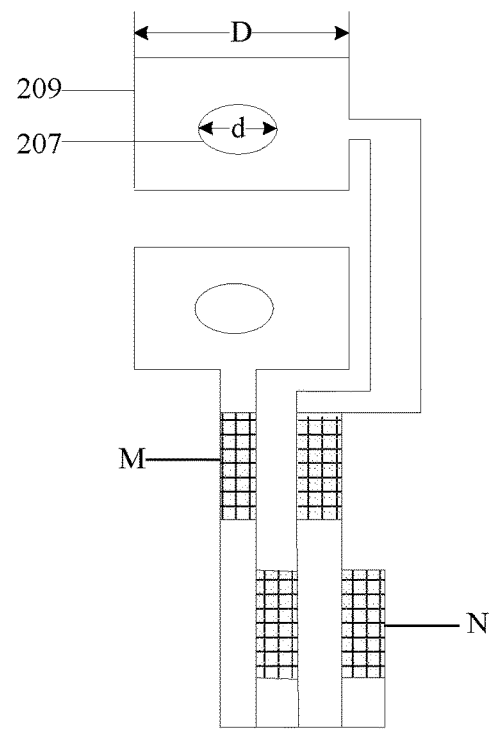
FIG. 3a is a structure schematic diagram of a connection hole and a connection terminal provided by an embodiment of the disclosure.
Figure 3B:
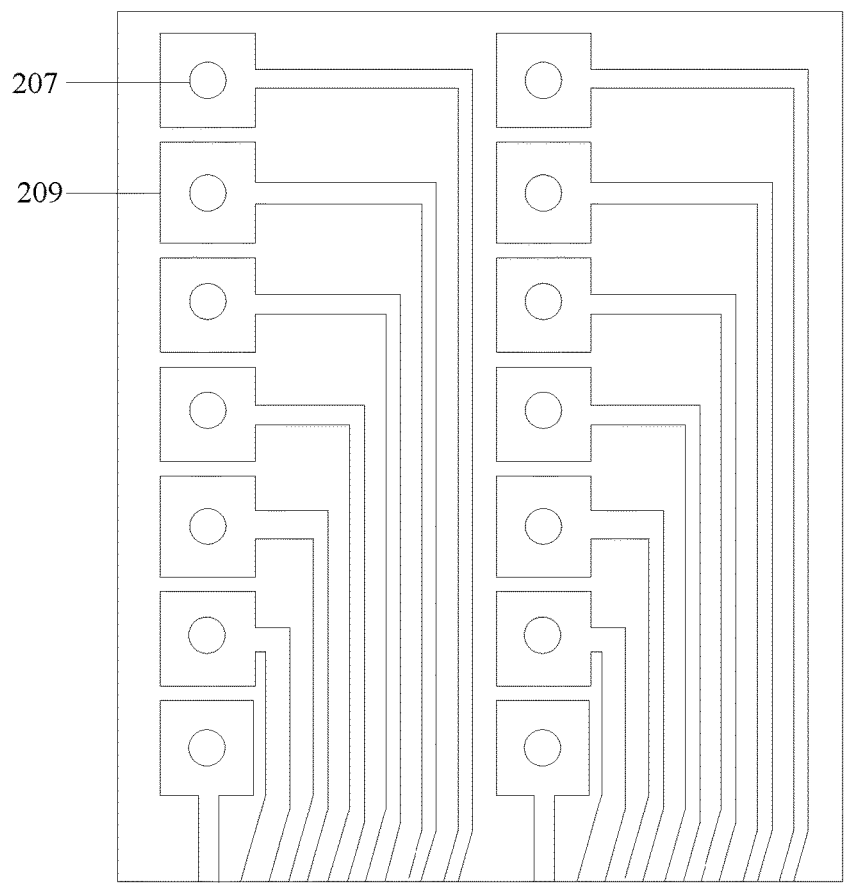
FIG. 3b is a structure schematic diagram of a connection relationship between signal lines around a display surface of a display substrate and connection terminals disposed on a COF film provided by an embodiment of the disclosure.

For example, in the above-mentioned display panel provided by the embodiment of the disclosure, in the case where the connection holes 207 penetrate the adhesive 203, in order to facilitate the implementation of the electrical connection between the signal lines 205 on the periphery region of the display surface of the display substrate 201 and the connection terminals 209 on the COF film 202, as illustrated in FIGS. 3a and 3b, the connection holes 207 are generally in one-to-one correspondence with the connection terminals 209; and the size D of the connection terminals 209 is generally larger than the aperture diameter d of the connection holes 207.

It should be noted that, in the above-mentioned display panel provided by the embodiment of the disclosure, the connection terminals 209 can have any shape, such as a triangle, a square or a circle, which is not limited herein. Also, when the shape of the connection terminals 209 is the circular, the diameter of the connection terminals 209 can be larger than the aperture diameter d of the connection holes 207; when the shape of the connection terminals 209 is the square, as illustrated in FIG. 3a, a side length of the connection terminals 209 is greater than the aperture diameter d of the connection holes 207.

In addition, in the above-mentioned display panel provided by the embodiment of the disclosure, as illustrated in FIG. 3a, terminals connected with pins of the integrated circuit chip 204 (as shown by the shaded area in the figure) can also be included. The terminal M which is connected to the connection terminal 209 by a wire is generally provided in a same layer as the connection terminal 209; the terminal N which is not connected to the connection terminals 209 can be disposed in the same layer as the connection terminals 209, or can be disposed in a different layer from the connection terminals 209, which will not be limited herein.

Generally, a number of connection terminals 209 of the COF film 202 is large and a density of the connection terminals 209 is high. In order to quickly and efficiently manufacture the connection holes 207 in one-to-one correspondence with the connection terminals 209, in the above-mentioned display panel provided by the embodiment of the disclosure, a laser punching process can be adopted. Also, by controlling the diameter and energy of the laser, the connection holes 207 having a desired aperture diameter and hole depth is obtained. Of course, the connection holes 207 can also be manufactured by other punching processes well known to those skilled in the art, which are not limited herein.

For example, in the above-mentioned display panel provided by the embodiment of the disclosure, as illustrated in FIG. 3a, the aperture diameter d of the respective connection hole 207 is greater than or equal to 25 i.e., the minimum value of the aperture diameter d of the respective connection holes 207 can be 25 μm.

For example, in the above-mentioned display panel provided by the embodiment of the disclosure, the display substrate 201 can specifically be a flexible display substrate or a rigid display substrate. Preferably, the display substrate 201 is a flexible display substrate, such as an electroluminescent display substrate (Organic Light Emitting Diodes, OLED), or a quantum dot display substrate (Quantum Dot Light Emitting Diodes, QLED), which are not limited herein.

For example, in the above-mentioned display panel provided by the embodiment of the disclosure, the COF film 202 is disposed in the periphery region of the side of the display substrate 201 opposite to the display surface. For example, the periphery region corresponds to the non-display region of the display substrate 201.

Figure 4:
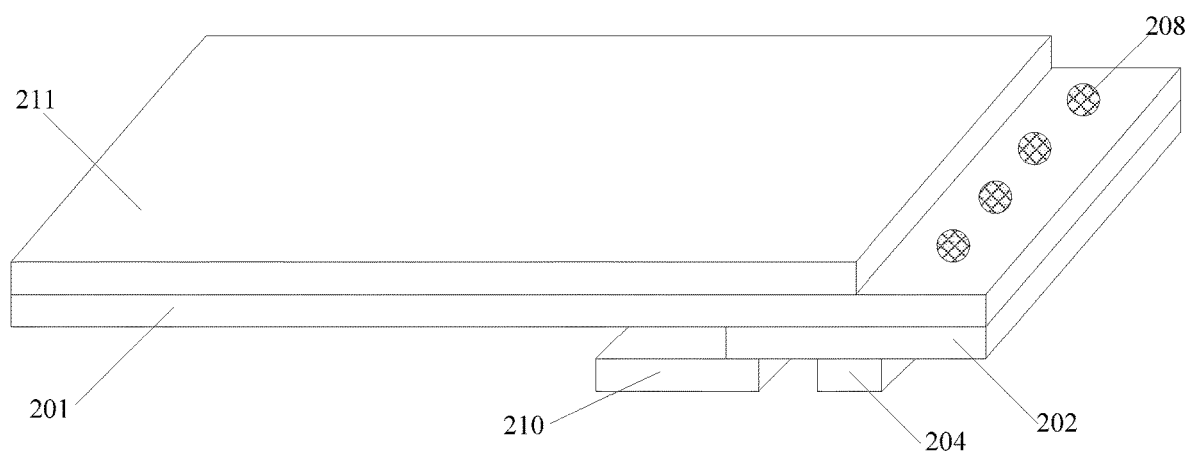
FIG. 4 is a perspective structure schematic diagram of a display panel provided by an embodiment of the disclosure.

Generally, the charge and control signals required for driving the pixels in the display panel are input from an external flexible printed circuit (FPC) and are transmitted to the signal lines 205 of the display panel by the COF film 202. Thus, in the above-mentioned display panel provided by the embodiment of the disclosure, as illustrated in FIG. 4, a flexible circuit board 210 that is bonded to the side of the COF film 202 opposite to the display substrate 201 can be further included.

For example, in order to enable the display panel to image, in the above-mentioned display panel provided by the embodiment of the disclosure, as illustrated in FIGS. 2a to 2d and FIG. 4, a polarizer 211 which is attached to a display region of the display surface of the display substrate 201 can be further included.

Based on the same inventive concept, the embodiment of the disclosure provides a method of manufacturing the above-mentioned display panel. Because the principle by which the solution of the manufacturing method solves the problem is similar to the principle by which the solution of the above-mentioned display panel solves the problem, the implementation of the manufacturing method provided by the embodiment of the disclosure can refer to the implementation of the above-mentioned display panel provided by the embodiment of the disclosure, and will not be repeated.

Figure 5:
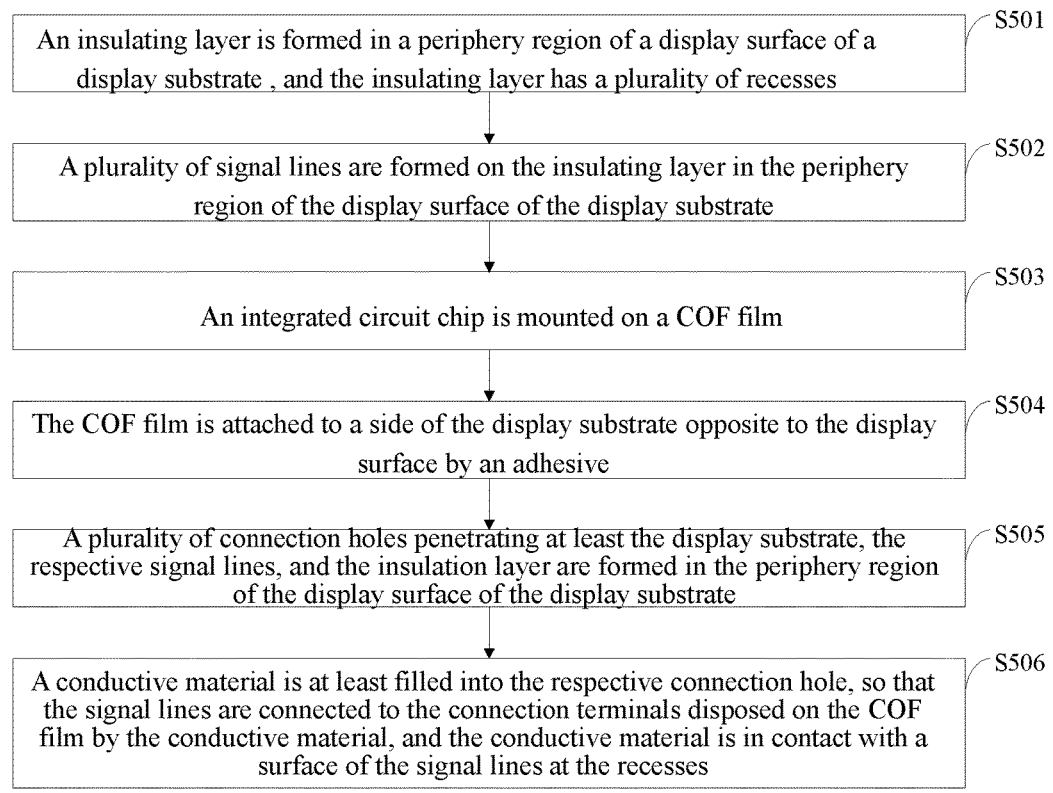
FIG. 5 is a flowchart of a method of manufacturing a display panel provided by an embodiment of the disclosure.

The embodiment of the disclosure provides a method of manufacturing a display panel. As illustrated in FIG. 5, for example, the following steps S501-S506 can be included.

S501, an insulation layer 206 is formed in a periphery region of a display surface of a display substrate 201, and the insulation layer 206 has a plurality of recesses a.

Figure 6A:
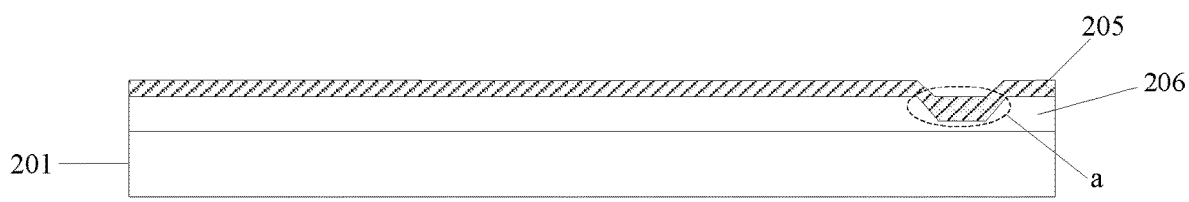
FIGS. 6a to 6d are structure schematic diagrams of a display panel corresponding to each step in the method of manufacturing the display panel provided by an embodiment of the disclosure respectively.

S502, a plurality of signal lines 205 are formed on the insulation layer 206 in the periphery region of the display surface of the display substrate 201, as illustrated in FIG. 6a.

S503, an integrated circuit chip 204 is mounted on a COF film 202.

Figure 6B:
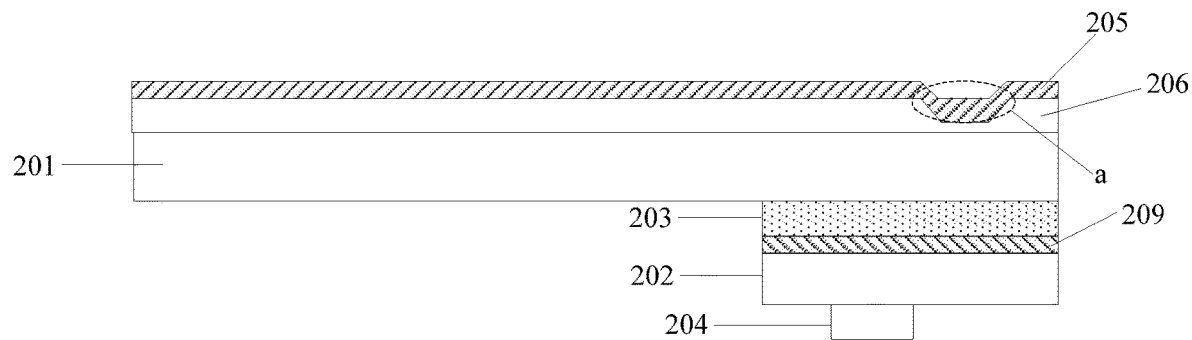

S504, the COF film 202 is attached to a side of the display substrate 201 opposite to the display surface by an adhesive 203; the integrated circuit chip 204 is located on a side of the COF film 203 opposite to the display substrate 201, as illustrated in FIG. 6b.

Figure 6C:
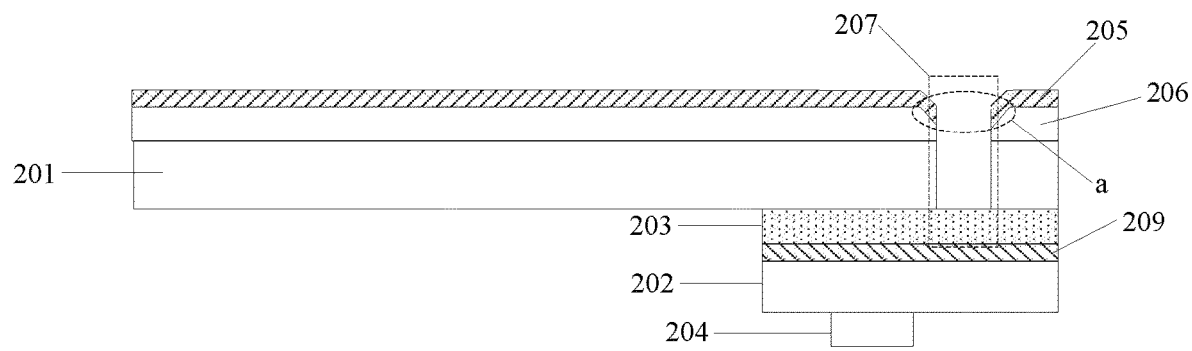

S505, a plurality of connection holes 207 penetrating at least the display substrate 201, the respective signal lines 205, and the insulation layer 206 are formed in the periphery region of the display surface of the display substrate 201; and each of the recesses surrounds the respective connection holes 207, as illustrated in FIG. 6c.

Figure 6D:
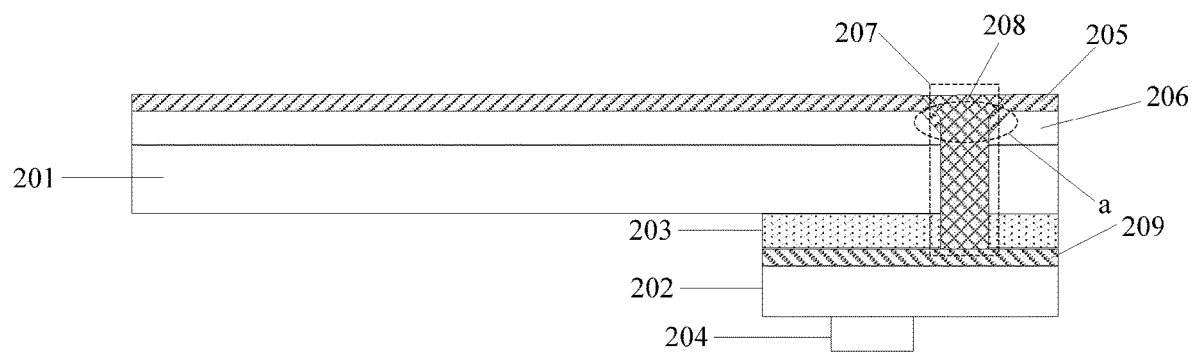

S506, a conductive material 208 is at least filled into the respective connection holes 207, so that the signal lines 205 are connected to the connection terminals 209 disposed on the COF film 202 by the conductive material 208, and the conductive material 208 is in contact with a surface of the signal lines 205 at the recesses a, as illustrated in FIG. 6d.

For example, in the above-described manufacturing method provided by the embodiment of the disclosure, because the insulation layer 206 is provided with the plurality of recesses a which surround the respective connection holes 207, it can ensure that the conductive material 208 is in contact with the surface of the signal lines 205 at the recesses a, which increases the contact area between the conductive material 208 and the signal lines 205, and can prevent the risk caused by failure of forming the holes and filling the conductive material 208, thereby increasing the product yield.

For example, in the above-mentioned manufacturing method provided by the embodiment of the disclosure, a nano-metal material is generally used as the conductive material 208. Based on this, in S506, the conductive material 208 is at least filled into the connection holes 207, which can be specifically implemented as follows: firstly, because the nano-metal slurry has fluidity, the nano-metal slurry can be injected from a side of the display substrate 201 into the connection holes 207 by a nozzle dripping method or an inkjet printing method; furthermore, in order to improve the fluidity of the nano-metal slurry and enhance the production efficiency, a heating process can be performed on the nano-metal slurry; then, because the nozzle dripping method or the ink-jet printing method can accurately control a position of injecting the liquid, no conductive material will be left in a region without the connection hole 207. In this way, after that, a cooling process can be performed on the display panel, so that the nano-metal slurry in the connection holes 207 is cured and shaped and has no fluidity, thereby the signal lines 205 are electrically connected to the connection terminals 209 by the material of cured nano-metal slurry.

Alternatively, in the above-mentioned manufacturing method provided by the embodiment of the disclosure, in S506, the conductive material 208 is filled into at least the respective connection holes 207, which can be specifically implemented as follows: firstly, because the nano-metal slurry has fluidity, the nano-metal slurry can be formed in the periphery region of the display surface of the display substrate 201 by a coating method or a screen printing method, so that the nano-metal slurry is filled into the connection holes 207. In this case, a portion of the nano-metal slurry is remained in a region outside the connection holes 207 in the periphery region of the display surface; furthermore, in order to improve the fluidity of the nano-metal slurry and enhance the production efficiency, a heating process can be performed on the nano-metal slurry; then a cooling process can be performed on the periphery region of the display surface, so that the nano-metal slurry in the connection holes 207 is cured and shaped; in this case, the portion of the nano-metal slurry remained in the region outside the connection holes 207 in the periphery region of the display surface can be cured and shaped or can be remained in a liquid state; finally, water or airflow is used to remove the nano-metal slurry outside the connection holes 207 to prevent the interference from short-circuit of the conductive material 208 in the region without the contact holes 207.

Based on the same inventive concept, an embodiment of the disclosure further provides a display device comprising the above-mentioned display panel provided by the embodiment of the disclosure. The display device can be any product or component having a display function, such as a mobile phone, a tablet, a television, a display, a notebook, a digital photo frame, a navigator, a smart watch, a fitness wristband, and a personal digital assistant. The implementation of the display device can refer to the above-mentioned embodiment of the display panel, and will not be repeated here.

In the above-mentioned display panel, the manufacturing method thereof and the display device provided by the embodiments of the present disclosure, because the adhesive film is used to attach the COF film to the side of the display substrate opposite to the display surface, and then the conductive material 208 is disposed in the connection holes penetrating at least the display substrate, the respective signal lines and the insulation layer, a connection between the signal lines in the periphery region of the display surface of the display substrate and the connection terminals disposed on the COF film can be implemented. Therefore, the connection terminal bending process is not required, so that the connection terminal bend region will not exist at the periphery region of the display panel, thereby making the display panel bezel narrower. Also, because the insulation layer is provided with the plurality of recesses around the respective connection holes, it can ensure that the conductive material contacts the surface of the signal lines at the recesses, which increases the contact area between the conductive material and the signal lines, and can prevent the risk caused by failure of forming the holes and filling the conductive material, thereby increasing the product yield.

What are described above is related to the illustrative embodiments of the disclosure only and not limitative to the scope of the disclosure; the scopes of the disclosure are defined by the accompanying claims.

The application claims priority of the Chinese patent application No. 201710456618.2, filed on Jun. 16, 2017, the entire disclosure of which is incorporated herein by reference as part of the present application.

The invention claimed is:

1. A display panel comprising: a display substrate, a film for chip-on-film (COF film) disposed on a side of the display substrate opposite to a display surface of the display substrate, and an integrated circuit chip fixed on a side of the COF film opposite to the display substrate, further comprising in a periphery region of the display substrate:
   a plurality of signal lines, disposed on the display surface of the display substrate;
   an insulation layer, located between the signal lines and the display substrate;
   a plurality of connection holes, penetrating at least the display substrate, the signal lines and the insulation layer; and
   a conductive material, filled in the connection holes,
   wherein the signal lines are connected to connection terminals disposed on the COF film by the conductive material,
   wherein the insulation layer has recesses each of which surrounds the respective connection holes, and the conductive material is in contact with a surface of the signal lines at the recesses.

2. The display, panel, according to, claim 1, further comprising: an adhesive, disposed between the display substrate and the COF film, the COF film being fixed on the side of the display substrate opposite to the display surface by the adhesive.

3. The display panel according to claim 1, wherein a surface of the conductive material in contact with the signal lines is flush with a surface of the signal lines in a region outside the recesses.

4. The display panel according to claim 1, wherein the conductive material is a nano-metal material.

5. The display panel according to claim 4, wherein the nano-metal material is a nano-silver material.

6. The display panel according to claim 5, wherein an aperture diameter of each the connection holes is greater than or equal to 25 µm; and a diameter of the nano-silver material is less than 3 µm.

7. The display panel according to claim 2, wherein the adhesive is an anisotropic conductive adhesive, and the connection holes penetrate only the display substrate, the signal lines, and the insulation layer;
   the connection terminals are disposed on a side of the COF film facing the display substrate; and
   the signal lines are connected to the connection terminals by the conductive material and the anisotropic conductive adhesive.

8. The display panel according to claim 2, wherein the connection holes penetrate the display substrate, the signal lines, the insulation layer and the adhesive;
   the connection terminals are disposed on a side of the COF film facing the display substrate.

9. The display panel according to claim 2, wherein the connection holes penetrate the display substrate, the signal lines, the insulation layer, the adhesive, and the COF film; the connection terminals are disposed on a side of the COF film opposite to the display substrate.

10. The display panel according to claim 8, wherein the connection holes are in one-to-one correspondence with the connection terminals; and a size of each of the connection terminals is larger than an aperture diameter of each of the connection holes.

11. The display panel according to claim 1, further comprising:
a flexible circuit board, bonded to a side of the COF film opposite to the display substrate.

12. A display device comprising the display panel according to claim 1.

13. A method of manufacturing a display panel, comprising:
forming an insulation layer in a periphery region of a display surface of a display substrate, and forming a plurality of recesses in a surface of the insulation layer;
forming a plurality of signal lines on the insulation layer in the periphery region of the display surface of the display substrate;
mounting an integrated circuit chip on a COF film;
attaching the COF film to a side of the display substrate opposite to the display surface with the integrated circuit chip being located on a side of the COF film opposite to the display substrate;
forming a plurality of connection holes penetrating at least the display substrate, the signal lines, and the insulation layer in a periphery region of the display substrate, and each of the recesses surrounding the respective connection holes; and filling a conductive material into the connection holes, so that the signal lines are connected to connection terminals disposed on the COF film by the conductive material, the conductive material being in contact with a surface of the signal lines at the recesses.

14. The method according to claim 13, wherein filling the conductive material into the connection holes comprises:
injecting a nano-metal slurry from a side of the display surface of the display substrate into the connection holes by a nozzle dripping method or an inkjet printing method; and
performing a cooling process on the display panel, so that the nano-metal slurry in the connection holes is cured.

15. The method according to claim 13, wherein filling the conductive material into the connection holes comprises:
forming a nano-metal slurry on the periphery region of the display surface of the display substrate by a coating method or a screen printing method, so that the nano-metal slurry is filled into the connection holes;
performing a cooling process at the connection holes of the display substrate, so that the nano-metal slurry in the connection holes is cured; and
removing the nano-metal slurry outside the connection holes.

16. The method according to claim 13, wherein the COF film is attached to the display substrate by an anisotropic conductive material and the plurality of connection holes are formed before the COF film is attached to the display substrate, and the anisotropic conductive material is in a conductive state only in an extending direction of the connection holes.

* * * * *